United States Patent
Lui et al.

(10) Patent No.: US 9,164,939 B2
(45) Date of Patent: Oct. 20, 2015

(54) CIRCUITRY AND TECHNIQUES FOR UPDATING CONFIGURATION DATA IN AN INTEGRATED CIRCUIT

(71) Applicant: Altera Corporation, San Jose, CA (US)

(72) Inventors: Tat Mun Lui, Petaling Jaya (MY); Ting Lok Song, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/058,935

(22) Filed: Oct. 21, 2013

(65) Prior Publication Data
US 2015/0113177 A1    Apr. 23, 2015

(51) Int. Cl.
*G06F 13/38* (2006.01)
*H03K 19/177* (2006.01)

(52) U.S. Cl.
CPC ........ *G06F 13/385* (2013.01); *H03K 19/17752* (2013.01); *H03K 19/17756* (2013.01)

(58) Field of Classification Search
CPC ............ G06F 15/7867; G06F 17/5054; H03K 19/17752; H03K 19/17756
See application file for complete search history.

(56) References Cited

U.S. PATENT DOCUMENTS

| | | | |
|---|---|---|---|
| 5,764,076 A * | 6/1998 | Lee et al. | 326/38 |
| 6,150,839 A * | 11/2000 | New et al. | 326/40 |
| 6,260,139 B1 * | 7/2001 | Alfke | 713/1 |
| 2004/0141386 A1 | 7/2004 | Karlsson | |
| 2005/0114473 A1 | 5/2005 | Guy et al. | |
| 2011/0058431 A1 * | 3/2011 | Gunwani et al. | 365/189.16 |
| 2011/0255441 A1 * | 10/2011 | Heinkel et al. | 370/254 |
| 2013/0232293 A1 * | 9/2013 | Nguyen et al. | 711/103 |
| 2013/0232328 A1 | 9/2013 | Johnson | |

OTHER PUBLICATIONS

PCIe Specification, Mar. 28, 2005, Revision 1.1, Chapter 7.*

* cited by examiner

*Primary Examiner* — Idriss N Alrobaye
*Assistant Examiner* — Ronald Modo (57) ABSTRACT

A method of operating an integrated circuit may include receiving an update request via an input-output protocol, such as the Peripheral Interconnect Component Express (PCIe) protocol. The integrated circuit is placed in an update mode when the update request is received. State information is stored in predefined registers on the integrated circuit and configuration data on the integrated circuit may be subsequently updated. An asserted update mode signal is stored in a status register on the integrated circuit to indicate that the integrated circuit is in the update mode. The configuration data may include a core configuration portion and a peripheral configuration portion. When the integrated circuit is in the update mode, only the core configuration is updated while the peripheral configuration portion may be preserved.

21 Claims, 5 Drawing Sheets

CIRCUITRY AND TECHNIQUES FOR UPDATING CONFIGURATION DATA IN AN INTEGRATED CIRCUIT

BACKGROUND

Programmable integrated circuit devices such as field-programmable gate arrays (FPGAs), complex programmable logic devices (CPLDs), and the like, may be used to implement a variety of functions. As an example, an FPGA device may be configured to perform various user functions based on different user designs.

Generally, an integrated circuit device includes a core region and a periphery region. A user design configuration may therefore be divided into two images: a core configuration image and a periphery configuration image. The core configuration image is used to configure logic elements or logic blocks in the core region while the periphery configuration image is used to configure peripheral elements such as input-output registers, transceiver blocks, etc.

To configure a device, a circuit designer may load the periphery image and the core image onto the device through a variety of available input-output protocols (e.g., the peripheral component interconnect express (PCIe) protocol). Typically, the circuit designer may modify and update the design at a later stage (e.g., in order to meet future application requirements), and may therefore load the updated core configuration image onto the device.

When the updated core configuration image is loaded onto the device, the device is reset. When the device is reset, application data or state information may be lost. Accordingly, once the device is reset, periphery settings that may be specific to the application (e.g., transceiver calibration information) are reset or overwritten with default settings even though the periphery configuration image has not been updated.

It is within this context that the embodiments described herein arise.

SUMMARY

Circuitry and techniques for updating configuration data in an integrated circuit are provided. Embodiments of the present invention include circuits and techniques that allow the configuration of an integrated circuit device to be updated without losing state information or application specific settings.

It is appreciated that the present invention can be implemented in numerous ways, such as a process, an apparatus, a system, or a device. Several inventive embodiments of the present invention are described below.

A method of operating an integrated circuit may include receiving an update request via an input-output protocol. As an example, the integrated circuit may be operating in a user mode and may receive an update request via the Peripheral Component Interconnect Express (PCIe) protocol while in the user mode. The integrated circuit is placed in an update mode when the update request is received. State information is stored in a predefined registers in the integrated circuit before configuration data on the integrated circuit is updated. An asserted update mode signal is stored in a status register on the integrated circuit to indicate that the integrated circuit has been (or was) placed in an update mode. When the integrated circuit is in the update mode, a portion of its configuration data may be retained.

A method of operating an integrated circuit may include placing the integrated circuit in a user mode while the integrated circuit is either in an update (or initialization) mode. An asserted status signal is retrieved from a status register. The integrated circuit may include multiple predefined registers that are used to store state information. Previous state information stored in the predefined registers may then be retrieved when the asserted status signal has been retrieved from the status register. The retrieved previous state information is then restored to core registers in the core region of the integrated circuit.

An integrated circuit may include input-output protocol circuitry that receives configuration data from an off-chip element. The configuration data may be received when the integrated circuit is operating in user mode (e.g., during normal operation). The integrated circuit may further include a dedicated status register and multiple predefined storage elements. The dedicated status register is used to store an asserted status signal based on the configuration data received while the predefined storage elements are used to store previous state information. Controller circuitry in the core region of the integrated circuit may be adapted to configure at least a portion of the integrated circuit with the configuration data received.

DETAILED DESCRIPTION

The embodiments provided herein include circuitry and techniques to update configuration data in an integrated circuit (IC) and restore the IC to its previous known state upon completion of the update operation.

It will be obvious, however, to one skilled in the art, that the present exemplary embodiments may be practiced without some or ail of these specific details. In other instances, well-known operations nave not been described in detail in order not to unnecessarily obscure the present embodiments.

Figure 1:
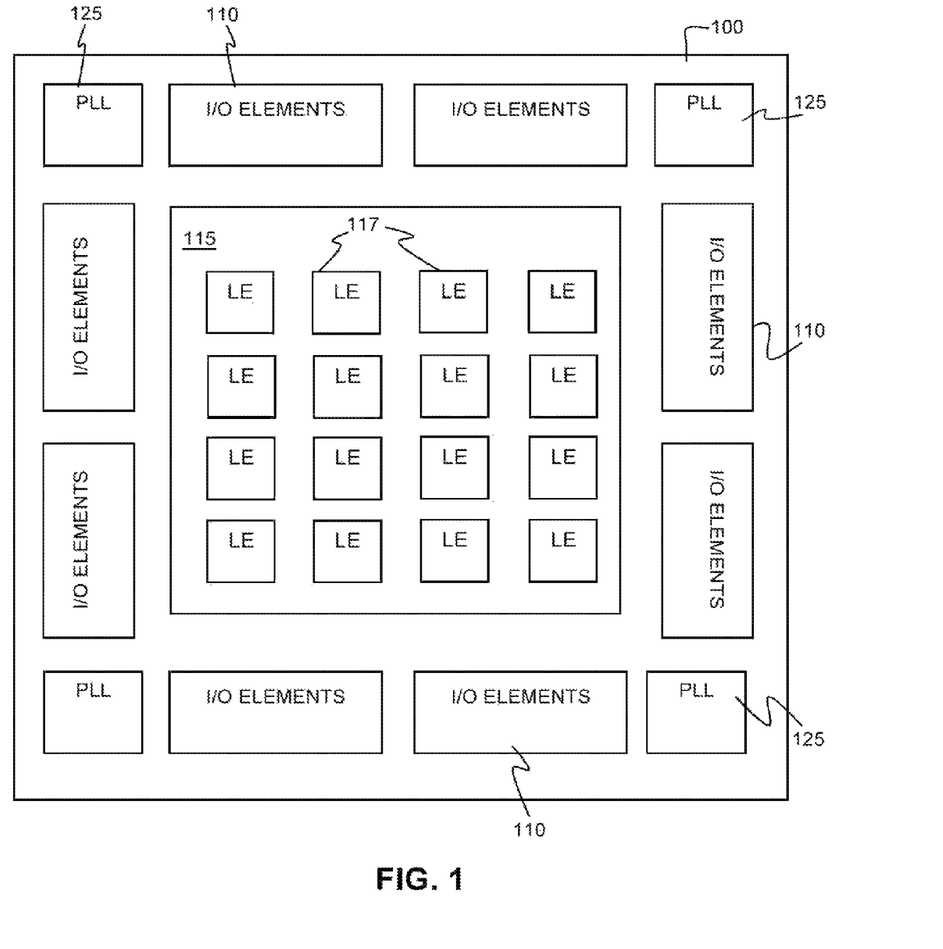
FIG. 1 is a simplified block diagram of an integrated circuit in accordance with one embodiment of the present invention.

An IC device such as a field-programmable gate array (FPGA) device, generally includes, among others, memory modules, logic blocks, clock generation circuitry, and input-output elements. FIG. 1, meant to be illustrative and not limiting, shows a simplified block diagram of IC 100 that can implement embodiments of the present invention. IC 100 includes core logic region 115 and input-output elements 110 located at the periphery region of IC 100. Other auxiliary circuits, such as phase-locked loops (PLLs) 125, for clock generation and timing can be located in the periphery region, adjacent to input-output elements 110.

It should be noted that a single device like IC 100 can potentially support a variety of different interfaces and each individual input-output bank 110 can support a different input-output standard with a different interface or protocol (e.g., high-speed serial interface protocol). Signals may be transmitted from core logic region 115 (and other logic blocks on IC 100) to external circuitry or other components that may be connected to IC 100 through input-output elements 110. Accordingly, signals received from external circuitry at input-output elements 110 may be routed from input-output elements 110 to core logic region 115 or other logic blocks (not shown) on IC 100. Core logic region 115 may then perform, functions based on the signals received.

Core logic region 115 may be populated with logic cells that may include "logic elements" (LEs) 117 or core registers, among other circuits. LEs 117 may further include look-up table-based logic regions and may be grouped into "Logic Array Blocks" (LABs). LEs 117 and groups of LEs or LABs can be configured to perform logical functions desired by the user. As an example, core logic region 115 may further include random access memory (RAM) elements, such as static random access memory (SRAM) cells, configuration RAM (CRAM) bits, look-up table RAM (LUTRAM) cells, that may be used to hold configuration data and provide different logic signals.

Configuration data loaded into configuration memory in core logic region 115 may accordingly foe used to produce control signals that configure any of the LEs 117 and groups of LEs and LABs to perform desired logical functions. In one known arrangement, configuration data used to configure IC device 100 may be divided into core configuration data and periphery configuration data. The core configuration data includes configuration information for LEs 117 (or other blocks) within core logic region 115, while the periphery configuration data includes configuration settings for circuits or logic elements in the periphery region of IC 100 (e.g., input-output elements 110, clock calibration settings, etc.). Configuration data may be loaded into IC 100 through different protocols that are supported by IC 100, such as the peripheral component interconnect express (PCIe) protocol. Accordingly, the configuration data loaded into IC 100 may be updated as needed (e.g., a portion of the configuration data, such as the core configuration data, may be overwritten while another portion, such as the periphery configuration data, may be retained).

Figure 2:
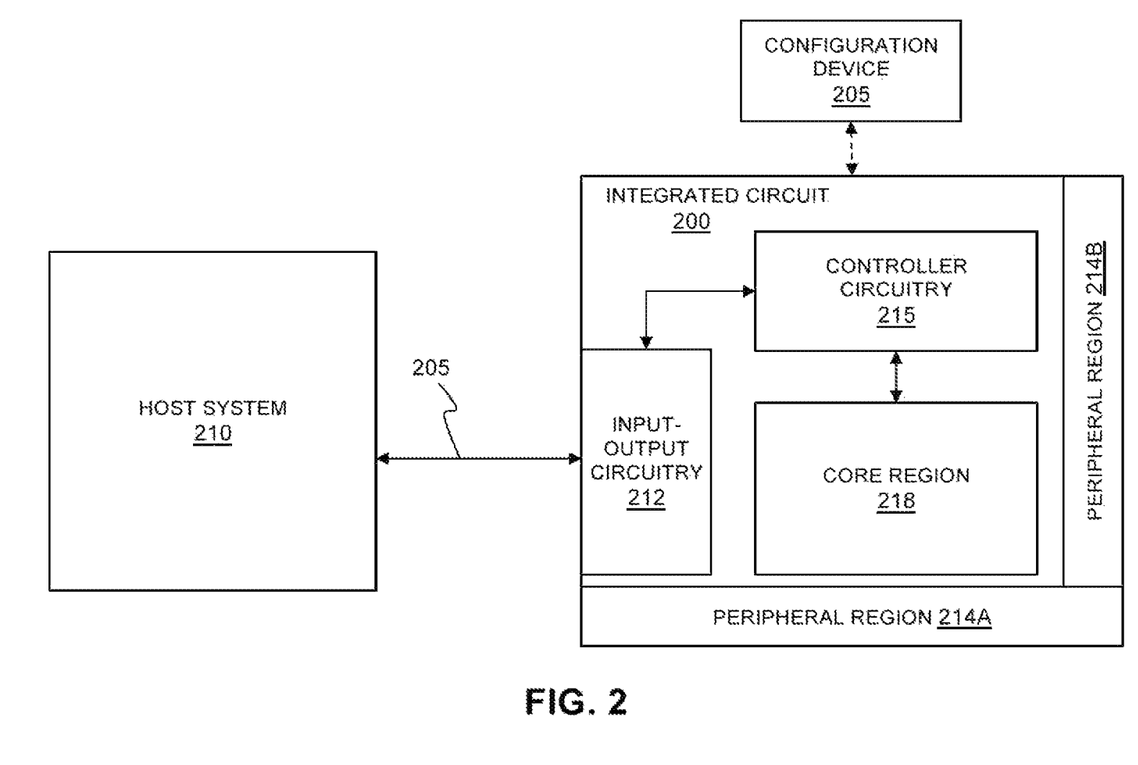
FIG. 2 shows an illustrative integrated circuit device coupled to a configuration device and a host system in accordance with embodiments of the present invention.

FIG. 2 shows illustrative IC device 200 coupled to configuration device 205 and host system 210 in accordance with embodiments of the present invention. Generally, configuration data is loaded onto IC device 200 via configuration device 205. Alternatively, instead of using an external flash or memory module such as configuration device 205, IC device 200 may be configured using host system 210.

In one embodiment, host system 210 may be a central processing unit (CPU) of a computer system that is coupled to IC 200 via link 205. As an example, link 205 may be a PCIe connector and input-output circuitry 212 is adapted to the PCIe protocol. Configuration data may be loaded from host system 210 to IC 200 via link 205. The configuration data is received at input-output circuitry 212 before being transmitted to controller circuitry 215, which then configures core region 219 with the received configuration data. It should be noted that well-known operations that are perforated by controller circuitry 215 when updating configuration information in core region 218 (e.g., resetting core registers, etc.) are not described in detail herein in order to not unnecessarily obscure the present invention.

In one embodiment, host system 210 may load different configuration images onto IC 200. For example, as explained above, configuration data may be divided into core configuration data and periphery configuration data. The core configuration data may be used to configure or reset core registers in core region 218 while periphery configuration data may be used to configure or reset circuitry in peripheral regions 214A and 214B.

Generally, at the very first instance IC 200 may be put in an "initialization mode" in order for both its core region 218 and peripheral regions 214A and 214B to be configured. When IC 200 is fully configured, it may enter "user mode" and may accordingly perform user specified functions, based on its configuration. Based on the actual user application, circuitry in peripheral regions 214A and 214B may be adjusted and tuned as desired. For example, transceiver channels in IC 200 may be trained or adapted to a particular speed to meet different application requirements.

In one embodiment, such application specific settings in peripheral regions 214A and 214B are not reset when the configuration in core region 218 is updated via host system 210 at a later time after IC 200 has been initialized. As an example input-output circuitry 212 may include PCIe circuitry that includes predefined data or state registers that may be used to store state information or application data when IC 200 is being updated. The stored state information may accordingly be restored to IC 200 once the update operation is complete (specific details of the update operation will be explained below with reference to FIGS. 3-5).

Figure 3:
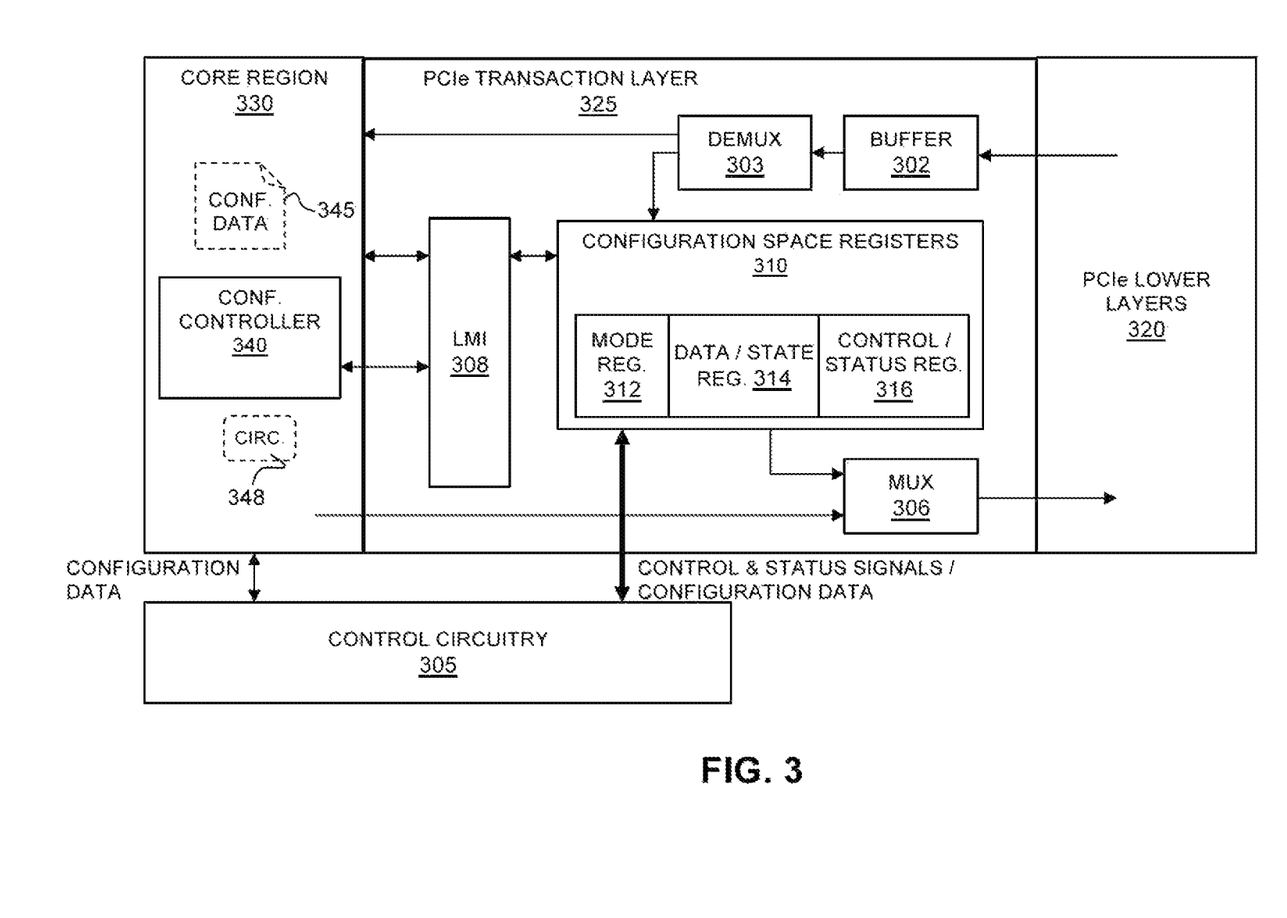
FIG. 3 shows illustrative peripheral component interconnect express (PCIe) circuitry with predefined registers for storing state information and a dedicated status mode register in accordance with embodiments of the present invention.

FIG. 3 shows illustrative PCIe circuitry with predefined registers for storing state information and a dedicated status mode register in accordance with embodiments of the present invention. PCIe circuitry includes PCIe transaction layer 325 and PCIe lower layers 320. It should be noted that PCIe transaction layer 325 manages communication between core region 330 and PCIe lower layers 320. As part of a complete PCIe protocol stack, PCIe lower layers 320 may include a data link layer and a physical layer, details of which are not shown in the embodiment of FIG. 3 in order to not obscure the present invention.

In one embodiment, the PCIe circuitry shown in FIG. 3 may be part of an IC (e.g., part of input-output circuitry 212 of IC 200 in FIG. 2. When the IC receives a data packet from a physical link (e.g., link 205 of FIG. 2), one data packet is transmitted from the PCIe lower layers 320 to PCIe transaction layer 325. Buffer 302 receives and transmits the data packet to demultiplexing circuit 303. According to the type of data contained in that particular data packet, demultiplexing circuit 303 may selectively transmit the data packet either to core region 330 or configuration space registers (CSRs) 310 in PCIe transaction layer 325. For example, if the data packet contains regular user data signals received during normal operation (e.g., during user mode) of the IC, the data packet may be transmitted to core region 330 or a user application layer (not shown) for further processing.

If the data packet contains configuration data, it may be routed to CSRs 310. In the embodiment of FIG. 3, CSRs 310 include mode register 312, data/state register 314, and control/status register 316. Mode register 312 may be a dedicated register that is used to store the configuration mode of the IC (e.g., update mode, initialization mode, etc.), data/state register 314 may be a group of predefined registers that are used to store state information or application specific data when configuration of the IC is being updated, and control/status register 316 may be a collection of registers that are used to monitor the status of a configuration operation on the IC device.

As an example, the IC may receive an update instruction from an external component via a PCIe physical link (e.g., a PCIe cable, a PCIe connector, etc). Before the existing configuration data 345 loaded in core region 330 is updated, state information and application data may be transmitted from core region 330 to predefined data/state register 314 via local management interface (LMI) circuit 308 and an asserted update status signal may be stored in mode register 312. It should be noted that LMI circuit 308 allows access for user application in core region 330 to store data to and access status and data from the registers in CSRs 310. In one embodiment, core region 330 may include a compression circuit 348 (and/or an encryption circuit) to compress (and/or encrypt) the application data or state information before transmitting the compressed (and/or encrypted) data via LMI 308 to data/state information register 314.

After state information and relevant application data have been transmitted to data/state register 314, configuration data 345 may be updated. To configure the IC or update configuration data 345, the received updated configuration information may be transmitted from CSRs 310 to configuration controller circuitry 340 in core region 330 via control circuitry 305. It should be noted that control/status register 316 in configuration space registers 310 may transmit and receive control and status signals during the configuration operation. Configuration controller 340 may update configuration data 345 loaded in core region 330 with the updated configuration. For the sake of brevity, specific details of the configuration of an IC device are not described herein.

After configuration data 345 has been updated, the previous state information stored in data/state register 314 may be restored to core region 330. In one embodiment, after an update operation, mode register 312 is accessed to determine the current configuration mode. If the update status mode signal is asserted, then the previous state information is restored to core region 330. Otherwise, if the initialization mode signal is asserted or the update status mode signal is deasserted, the peripheral configuration of the IC is updated and the settings for the periphery region (not shown in FIG. 3) are reset.

Depending on the mode of operation, multiplexing circuit 306 selectively transmits signals from either core region 330 or CSRs 310 out of the IC via the PCIe lower layers 320. For example, if the IC is in user mode, multiplexing circuit 306 transmits user data packet from core region 330 out of the IC. If the IC is in configuration initialization or update mode, multiplexing circuit 306 may transmit control or status signals from CSRs 310 out of the IC.

Figure 4:
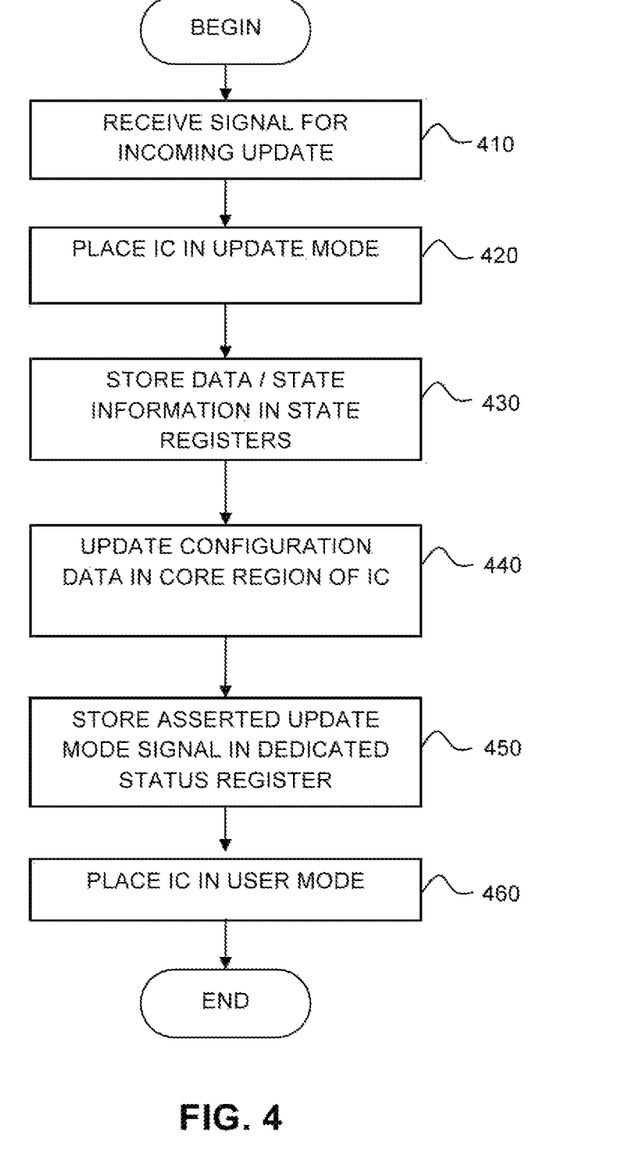
FIG. 4 shows illustrative steps for updating configuration data in an integrated circuit in accordance with embodiments of the present invention.

FIG. 4 shows illustrative steps for updating configuration data in an IC in accordance with embodiments of the present invention. At step 410, a signal for an incoming update operation is received by the IC. It should be noted that the IC may have already been configured and initialized. As such, the IC may receive the incoming update operation signal when it is operating under a user mode. For example, the IC may receive a data packet that contains a configuration update request. When such a request is received, the IC is placed in an update mode (or switched from the user mode to an update mode) at step 420. Application data and state information are stored in predefined state registers at step 430. As shown in FIG. 3, the predefined state registers may be part of the CSRs 310 in the PCIe transaction layer 325.

Configuration data in the core region of the IC is updated at step 440. As explained above, settings and configuration in the periphery region of the IC are not updated during an update operation. At step 450, an asserted update mode signal is stored in a dedicated status register (e.g., mode register 312 of FIG. 3). When the update operation is complete, the IC may foe placed back in the user mode at step 460.

Figure 5:
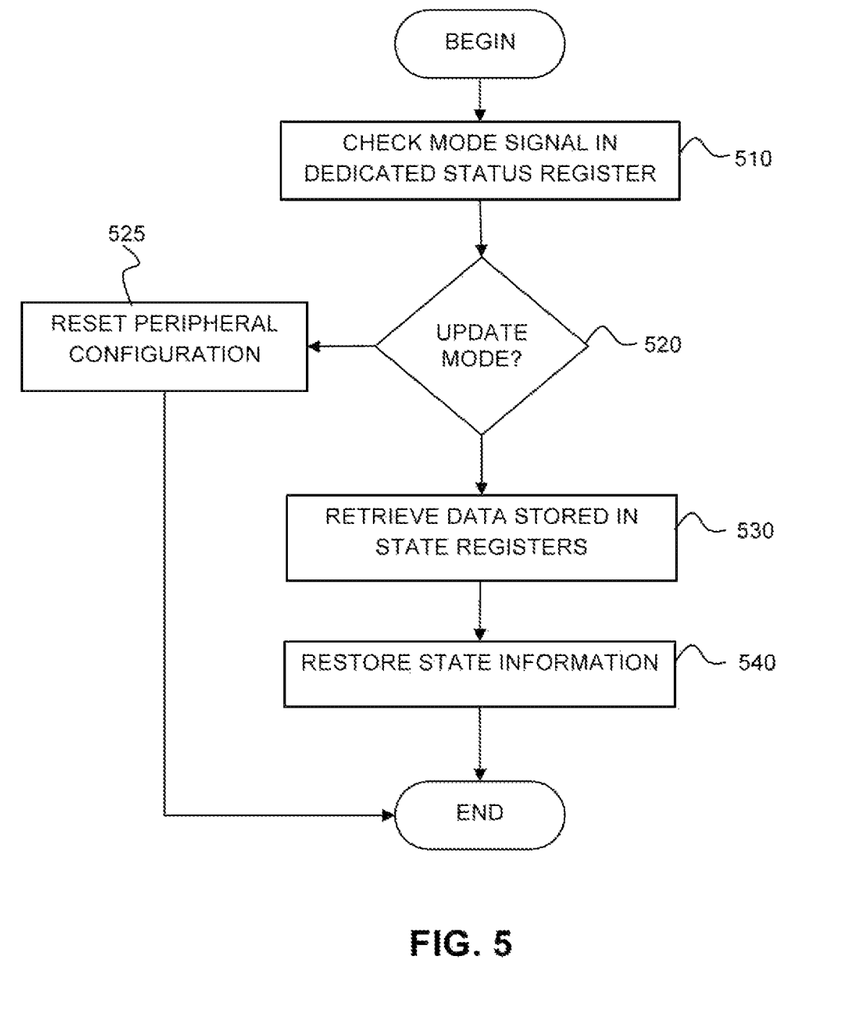
FIG. 5 shows illustrative steps for restoring previous state information and application data to an integrated circuit in accordance with embodiments of the present invention.

FIG. 5 shows illustrative steps for restoring previous state information and application data to an IC in accordance with embodiments of the present invention. At step 510, a mode signal stored in a dedicated status register is checked. In one embodiment, the dedicated status register may store an asserted update mode signal when an update operation such as that described in FIG. 4 is initiated. At step 520, the current mode of the IC is determined. If the IC is not in an update mode (e.g., the IC is in initialization mode), peripheral configuration of the IC is reset and initialized at step 525. If the IC is in an update mode (e.g., when an asserted update mode signal is retrieved from the dedicated status register), the data and state information stored in the predefined state registers is retrieved at step 530. The retrieved data and state information is restored to the IC at step 540.

At this stage, the IC may have been restored to its previous known state and may continue operating from that particular state. It should be appreciated that even though specific steps are shown in FIGS. 4 and 5, certain steps in the methods shown in FIGS. 4 and 5 may be omitted if desired. Alternatively, additional steps (e.g., encrypting or compressing the data and state information before storing them in the state registers, etc.) may be included in this context.

The embodiments, thus far, were described with respect to programmable logic circuits. The method and apparatus described herein may foe incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs) logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method of operating an integrated circuit, comprising:
   receiving a first data packet containing user data signals at an input of the integrated circuit via an input-output protocol during a user mode;
   in response to receiving the user data signals during the user mode, transmitting the first data packet to a core region of the integrated circuit for processing;
   receiving a second data packet containing an update request at the input of the integrated circuit via an input-output protocol during the user mode;
   in response to receiving the update request, placing the integrated circuit in an update mode, transmitting the second data packet to configuration registers, and storing state information in the configuration registers;
   updating configuration data of the integrated circuit after the storing of the state information; and
   storing an asserted update mode signal in the configuration registers on the integrated circuit.

2. The method defined in claim 1, wherein the input-output protocol comprises a Peripheral Component Interconnect Express (PCIe) protocol, wherein the configuration registers comprise a plurality of configuration space registers (CSRs), and wherein the receiving the update request comprises:
   receiving the second data packet via the PCIe protocol, wherein the second data packet comprises a packet header;
   identifying a type of information in the second data packet based on the packet header; and
   in response to identifying configuration data in the second data packet, transmitting the second data packet to the plurality of CSRs.

3. The method defined in claim 2, wherein the plurality of configuration space registers (CSRs) includes a status register and a plurality of predefined registers, the method further comprising:
   storing user data from the core region of the integrated circuit to the plurality of predefined registers, wherein storing the asserted update mode signal comprises storing the asserted update mode signal in the status register.

4. The method defined in claim 1, wherein the configuration registers comprise a plurality of predefined registers and a status register, and wherein the state information is stored in the plurality of predefined registers prior to placing the integrated circuit in the update mode, the method further comprising:
   placing the integrated circuit in a user mode;
   retrieving the asserted update mode signal from the status register; and
   in response to retrieving the asserted update mode signal, restoring the state information stored in the plurality of predefined registers.

5. The method defined in claim 4, wherein the update request is received while the integrated circuit is in the user mode.

6. The method defined in claim 1 further comprising:
   with compression circuitry, compressing the state information prior to storing the state information in the configuration registers.

7. The method defined in claim 1, wherein the configuration data comprises core configuration data and peripheral configuration data, and wherein updating the configuration data of the integrated circuit comprises:
   updating only the core configuration data while preserving the peripheral configuration data.

8. The method defined in claim 1, further comprising:
   in response to placing the integrated circuit in the update mode, transmitting signals from the configuration registers out of the integrated circuit.

9. The method defined in claim 8, wherein transmitting signals out of the integrated circuit comprises:
   with multiplexer circuitry, receiving a first input from the core region of the integrated circuit and a second input from the configuration registers; and
   controlling the multiplexer circuitry to output signals from the second input.

10. The method defined in claim 1, wherein receiving first and second data packets at the input comprises receiving the first and second data packets at demultiplexer circuitry, the method further comprising:
    using the demultiplexer circuitry to route the first data packet to the core region of the integrated circuit based on contents of the first data packet; and
    using the demultiplexer circuitry to route the second data packet to the configuration registers based on contents of the second data packet.

11. A method of operating an integrated circuit, the method comprising:
    while the integrated circuit is in a first mode, placing the integrated circuit in a second mode that is different from the first mode;
    retrieving a status signal stored in a status register;
    in response to detecting that the status signal is deasserted, initializing the integrated circuit; and
    in response to detecting that the status signal is asserted, retrieving a previous state information stored in a plurality of predefined registers and restoring the previous state information to a plurality of registers in a core region of the integrated circuit.

12. The method defined in claim 11, wherein the first mode comprises an update mode, and wherein the second mode comprises a user mode, the method further comprising:
    while the integrated circuit is in the user mode, receiving an update request at the integrated circuit via an input-output protocol;
    in response to receiving the update request, placing the integrated circuit in the update mode; and
    updating configuration data of the integrated circuit after the storing of the previous state information.

13. The method defined in claim 12 further comprising:
    storing the status signal in the status register prior to placing the integrated circuit in the update mode.

14. The method defined in claim 12 further comprising:
    storing the previous state information in the plurality of predefined registers prior to updating the configuration data.

15. The method defined in claim 14, wherein the integrated circuit comprises Peripheral Component Interconnect Express (PCIe) circuitry, wherein the plurality of predefined registers comprises at least one data retention register from a plurality of configuration space registers (CSRs) in the PCIe circuitry, and wherein storing the previous state information in the plurality of predefined registers comprises:
    storing user data from the core region of the integrated circuit to the at least one data retention register.

16. The method defined in claim 15, wherein the integrated circuit comprises interface circuitry that is adapted to communicate with the core region and the plurality of CSRs in the PCIe circuitry, and wherein restoring the previous state information to the plurality of registers in the core region of the integrated circuit comprises:

accessing the at least one data retention register using the interface circuitry; and retrieving the user data stored in the at least one data retention register.

17. An integrated circuit comprising:

input-output protocol circuitry that receives configuration data from an off-chip element when the integrated circuit is in a first operating mode, wherein the input-output protocol circuitry comprises Peripheral Component Interconnect Express (PCIe) protocol circuitry that includes a plurality of configuration space registers;

a dedicated status register in the plurality of configuration space registers that stores an asserted status signal based at least in part on the configuration data received;

a plurality of predefined storage elements in the plurality of configuration space registers that stores previous state information based on the asserted status signal;

controller circuitry in a core region of the integrated circuit that is adapted to configure at least a portion of the integrated circuit with the configuration data received and that is further adapted to transfer the previous state information from the core region to the plurality of predefined storage elements when the integrated circuit is being placed in a second operating mode that is different than the first operating mode; and interface circuitry that communicates with the controller circuitry and the plurality of configuration space registers, wherein the previous state information is transferred from the controller circuitry to the plurality of predefined storage elements via the interface circuitry.

18. The integrated circuit defined in claim 17, wherein the first mode comprises a user mode, wherein the second mode comprises an update mode, and wherein the asserted status signal comprises an asserted update mode signal.

19. The integrated circuit defined in claim 18, wherein the controller circuitry is adapted to restore the previous state information from the plurality of predefined storage elements to the core region based on the asserted update mode signal.

20. The integrated circuit of claim 18, wherein the core region includes core configuration data, the integrated circuit further comprising:

a peripheral region having peripheral configuration data, wherein the controller circuitry is adapted to update only the core configuration data based on the configuration data received and further adapted to maintain the peripheral configuration based on the asserted update mode signal.

21. The integrated circuit defined in claim 20, wherein the peripheral region comprises transceiver circuitry, and wherein the peripheral configuration data comprises user settings for the transceiver circuitry.

* * * * *